United States Patent
Campbell et al.

(10) Patent No.: US 10,328,535 B2
(45) Date of Patent: Jun. 25, 2019

(54) SELF-HEATING SOLDER FLUX MATERIAL

(71) Applicant: International Business Machines Corporation, Armonk, NY (US)

(72) Inventors: Eric J. Campbell, Rochester, MN (US); Sarah K. Czaplewski, Rochester, MN (US); Joseph Kuczynski, North Port, FL (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 347 days.

(21) Appl. No.: 15/344,850

(22) Filed: Nov. 7, 2016

(65) Prior Publication Data
US 2018/0126497 A1    May 10, 2018

(51) Int. Cl.
  *B23K 1/00*    (2006.01)
  *B23K 3/00*    (2006.01)
  *B23K 35/00*   (2006.01)
  *B23K 35/36*   (2006.01)
  *B23K 35/368*  (2006.01)
  (Continued)

(52) U.S. Cl.
  CPC ........ *B23K 35/3615* (2013.01); *B23K 1/0006* (2013.01); *B23K 1/0016* (2013.01); *B23K 1/203* (2013.01); *B23K 3/082* (2013.01); *B23K 35/3601* (2013.01); *B23K 35/365* (2013.01); *B23K 35/368* (2013.01); *H05K 3/3489* (2013.01); *H05K 3/3494* (2013.01);
  (Continued)

(58) Field of Classification Search
  CPC .. B23K 1/0016; B23K 1/203; B23K 35/3601; B23K 3/082
  See application file for complete search history.

(56) References Cited

U.S. PATENT DOCUMENTS 3,585,982 A    6/1971    Hollinshead
3,653,372 A    4/1972    Douglas
(Continued)

FOREIGN PATENT DOCUMENTS

CA    918331        1/1973
CN    1305403 A     7/2001
(Continued)

OTHER PUBLICATIONS

AUS920160550US1, Appendix P; List of IBM Patent or Applications Treated as Related, May 25, 2017, 2 pages.
(Continued)

*Primary Examiner* — Erin B Saad
(74) *Attorney, Agent, or Firm* — Jared L. Montanaro

(57) ABSTRACT

A self-heating solder flux material includes a solder flux material and a multi-compartment microcapsule. The solder flux material includes a solvent carrier, and the multi-compartment microcapsule includes a first compartment, a second compartment, and an isolating structure. The first compartment contains a first reactant, and the second compartment contains a second reactant. The isolating structure separates the first compartment from the second compartment. The isolating structure is adapted to rupture in response to a stimulus. Rupture of the isolating structure results in an exothermic reaction between the first reactant and the second reactant. The exothermic reaction generates heat to volatilize the solvent carrier.

20 Claims, 7 Drawing Sheets

(51) Int. Cl.
| | |
|---|---|
| *B23K 35/365* | (2006.01) |
| *H05K 3/34* | (2006.01) |
| *B23K 1/20* | (2006.01) |
| *B23K 3/08* | (2006.01) |

(52) U.S. Cl.
CPC ... *H05K 3/3484* (2013.01); *H05K 2203/0425* (2013.01); *H05K 2203/104* (2013.01)

(56) References Cited

U.S. PATENT DOCUMENTS

| | | | |
|---|---|---|---|
| 4,095,583 | A | 6/1978 | Petersen et al. |
| 5,904,796 | A | 5/1999 | Freuler et al. |
| 5,984,995 | A | 11/1999 | White |
| 6,114,413 | A | 9/2000 | Kang et al. |
| 6,518,330 | B2 | 2/2003 | White et al. |
| 6,947,285 | B2 | 9/2005 | Chen et al. |
| 7,290,549 | B2 | 11/2007 | Banerjee et al. |
| 7,816,785 | B2 | 10/2010 | Iruvanti et al. |
| 7,834,442 | B2 | 11/2010 | Furman et al. |
| 7,886,813 | B2 | 2/2011 | Hua et al. |
| 8,174,112 | B1 | 5/2012 | Karp et al. |
| 8,206,515 | B2 | 6/2012 | Nishina et al. |
| 8,518,682 | B2 | 8/2013 | Freyman et al. |
| 8,741,804 | B2 | 6/2014 | Boday et al. |
| 8,829,082 | B2 | 9/2014 | Boday et al. |
| 8,896,110 | B2 | 11/2014 | Hu et al. |
| 9,856,404 | B2 * | 1/2018 | Campbell ............... C09J 11/04 |
| 2004/0086493 | A1 * | 5/2004 | Hubbell ............. C08B 37/0084 424/93.7 |
| 2006/0079021 | A1 | 4/2006 | Yang |
| 2006/0228542 | A1 | 10/2006 | Czubarow |
| 2008/0038540 | A1 | 2/2008 | Hirayama et al. |
| 2011/0039980 | A1 | 2/2011 | Caruso et al. |
| 2012/0184682 | A1 | 7/2012 | Dasgupta |
| 2013/0034739 | A1 | 2/2013 | Boday et al. |
| 2013/0338280 | A1 | 12/2013 | Boday et al. |
| 2014/0110049 | A1 | 4/2014 | Yuen et al. |
| 2014/0368992 | A1 | 12/2014 | Strader et al. |
| 2017/0129825 | A1 | 5/2017 | Campbell et al. |
| 2017/0130102 | A1 | 5/2017 | Campbell et al. |
| 2017/0130993 | A1 | 5/2017 | Campbell et al. |
| 2018/0064812 | A1 | 3/2018 | King et al. |

FOREIGN PATENT DOCUMENTS

| | | |
|---|---|---|
| CN | 1794979 A | 6/2006 |
| CN | 103626804 A | 3/2014 |
| CN | 103740978 A | 4/2014 |
| CN | 103740997 A | 4/2014 |
| CN | 103626804 B | 4/2016 |
| CN | 103976976 B | 5/2016 |
| EP | 0206620 A2 | 12/1986 |
| GB | 209479 A | 1/1924 |
| JP | 04100594 A | 4/1992 |
| JP | 08025083 A | 1/1996 |
| JP | 2000317578 A | 11/2000 |
| JP | 2001176924 A | 6/2001 |
| JP | 4073571 B2 | 2/2008 |
| KR | 1020140051091 A | 4/2014 |
| KR | 101494100 B1 | 2/2015 |
| TW | 200425250 A | 11/2004 |
| WO | WO-2009029804 A2 | 3/2009 |
| WO | WO-2011086018 A1 | 7/2011 |
| WO | WO-2014204828 A2 | 12/2014 |

OTHER PUBLICATIONS

Brown et al., *In situ poly(urea-formaldehyde) microencapsulation of dicyclopentadiene*, Journal of Microencapsulation, Nov.-Dec. 2003, vol. 20, No. 6, pp. 719-730, Taylor & Francis Ltd (online, www.tandf.co.uk/journals), DOI: 10.1080/0265204031000154160.
Yu et al., *Supramolecular hydrogel microcapsules via cucurbit[8]uril host-guest interactions with triggered and UV-controlled molecular permeability*, Journal, Chemical Science, Issue 6, Jun. 2015, Royal Society of Chemistry, London, UK, DOI: 10.1039/c5sc01440a.
Bogdanowicz et al., *Preparation and Characterization of Light-Sensitive Microcapsules Based on a Liquid Crystalline Polyester*, Langmuir, Feb. 2013, vol. 29, Issue 5, pp. 1601-1608, American Chemical Society (published on Web Dec. 2012), Washington, DC.
Kreft et al., *Shell-in-Shell Microcapsules: A Novel Tool for Integrated, Spatially Confined Enzymatic Reactions*, Angewandte Chemie, Int. Ed., Jul. 2007 (online Jun. 2007), vol. 46, Issue 29, pp. 5605-5608, Wiley-VCH Verlag GmbH & Co., KGaA, Weinheim, DOI: 10.1002/anie.200701173.
Xiong et al., *Towards Theranostic Multicompartment Microcapsules: in-situ Diagnostics and Laser-induced Treatment*, Theranostics, vol. 3, Issue 3, Feb. 2013, pp. 141-151, Ivyspring International, Sydney, Australia.
Marzzacco, *The Effect of a Change in the Catalyst on the Enthalpy of Decomposition of Hydrogen Peroxide*, pp. 12-13, Chem 13 News, Nov. 2008, reprinted from pp. 16-17, May 2001, University of Waterloo, Waterloo, ON, Canada.
Masin, *The Chemistry of Hand Warmers*, 3 pages, chemistryislife.com (online), accessed Jun. 5, 2017, URL: www.chemistryislife.com/the-chemistry- of-hand-warmer.
Unknown, *Flameless Chemical Heaters*, zenstoves.net (online), 4 pages, acessed Jun. 5, 2017, URL: http://zenstoves.net/Flameless.htm.
Unknown, *Flameless Ration Heater (FRH)*, MREInfo.com (online), 2014, 5 pages, accessed Jun. 5, 2017, URL: www.mreinfo.com/us/mre/frh.html.
Kawashita et al., *In vitro heat generation by ferrimagnetic maghemite microspheres for hyperthermic treatment of cancer under alternating magnetic field*, Journal of Materials Science: Materials in Medicine, vol. 19, Issue 5, pp. 1897-1903, May 2008, (Abstract Only, 2 pages), URL: www.ncbi.nlm.nih.gov/pubmed/17914614.
Unknown, *PTFE Coatings, Specific Heat of Some Common Substances*, engineeringtoolbox.com (online), 7 pages, accessed Jun. 5, 2017, URL: www.engineeringtoolbox.com/specific-heat-capacity-d_391.html.
Unknown, *Standard enthalpy change of formation (data table)*, Wikipedia.org (online), 13 pages, accessed Jun. 5, 2017, URL: en.wikipedia.org/wiki/Standard_enthalpy_change_of_formation_%28data_table%29.
Unknown, *Technical Overview: Microencapsulation*, microteklabs.com (online), 4 pages, accessed Jun. 5, 2017, URL: www.microteklabs.com/technical_overview.pdf.
Unknown, *Thermochemistry*, 7 pages, Olomouc—Hejčín Gymnasium (online), 7 pages, accessed Jun. 5, 2017, URL: http://smd.gytool.cz/downloads/thermochemistry_bar.pdf.
Delcea et al., *Multicompartmental Micro- and Nanocapsules: Hierarchy and Applications in Biosciences*, Macromolecular Bioscience, vol. 10, May 2010, pp. 465-474, Wiley-VCH Verlag GmbH & Co., Weinheim.
Lee, *Microencapsulated Heat Generating Material to Accelerate the Curing Process During Liquid Crystal Display Fabrication*, NineSigma, Inc. (online), 2014 (month unknown), 3 pages, accessed Jun. 5, 2017, URL: https://ninesights.ninesigma.com/rfps/-/rfp-portlet/rfpViewer/2690.
Keller et al., *Mechanical Properties of Microcapsules Used in a Self-Healing Polymer*, Experimental Mechanics, vol. 46, Nov. 2006, pp. 725-733, Society for Experimental Mechanics, Bethel, CT.
Hu et al., *Controlled Rupture of Magnetic Polyelectrolyte Microcapsules for Drug Delivery*, Langmuir, vol. 24, Sep. 2008, pp. 11811-11818, American Chemical Society, USA.
Unknown, *Materials for Sealing Liquid Crystal*, Three Bond Technical News, vol. 43, May 1994, pp. 1-8, Three Bond Europe, UK.
Unknown, *Advanced Technologies for LCD Assembly*, DowCorning.com (online), 2014 (month unknown), 4 pages, accessed Jun. 5, 2017, URL: www.dowcorning.com/content/publishedlit/11-3437_Advanced_Technologies_LCD_Assembly.pdf?wt.svl=ELEC_LHH.
Unknown, *LOCTITE ECCOBOND DS 6601*, Henkel.com (online), Mar. 2013, 2 pages, URL: https://tds.us.henkel.com/NA/UT/HNAUTTDS.nsf/web/C0DD8377AB27D639852571341005DC4A1/$File/LOCTITE%20 ECCOBOND%20DS%206601-EN.pdf.

(56) References Cited

OTHER PUBLICATIONS

Stober et al., *Controlled Growth of Monodisperse Silica Spheres in the Micron Size Range*, Journal of Colloid and Interface Science, vol. 26, Jan. 1968, pp. 62-69, Elsevier Inc., Amsterdam.

Long et al., "Bio-inspired controlled release through compression-relaxation cycles of microcapsules", NPG Asia Materials (2015) 7, e148, Jan. 9, 2015, 7 pages, Springer Nature, Macmillan Publishers Limited, UK, DOI: 10.1038/am.2014.114.

Alvarez-Lorenzo et al., "Light-sensitive Intelligent Drug Delivery Systems", Photochemistry and Photobiology, vol. 85, Issue 4, Feb. 2009, pp. 848-860, Wiley Online Library (Wiley.com), DOI: 10.1111/j.1751-1097.2008.00530.x, URL: onlinelibrary.wiley.com/doi/10.1111/j.1751-1097.2008.00530.x/pdf.

Yuan et al., "Photocleavable Microcapsules Built from Photoreactive Nanospheres", Langmuir 2005, vol. 21, Issue 20, Aug. 2005, pp. 9374-9380, American Chemical Society, Washington, DC, DOI: 10.1021/la051491+.

Noa Lapidot et al., "Advanced Sunscreens: UV Absorbers Encapsulated in Sol-Gel Glass Microcapsules", Journal of Sol-Gel Science and Technology, vol. 26, Issue 1, Abstract Only, <http://link.springer.com/article/10.1023/A:1020785217895>, dated Jan. 2003, 2 pages.

Tagra, "Suncaps, Non-breakable and transparent microcapsules containing UV filters, ideal for all cosmetic formulations", tagra of the efal group, Tagra Biotechnologies Ltd., <http://www.in-cosmeticskorea.com/__novadocuments/237313?v=635983121662630000>, printed Nov. 1, 2016, 4 pages.

NIST, "UREA", National Institute of Standards and Technology, Material Measurement Laboratory, <http://webbook.nist.gov/cgi/cbook.cgi?ID=C57136&Mask=400#UV-Vis-Spec>, printed Nov. 1, 2016, 2 pages.

Yamaura et al., "Preparation and characterization of (3-aminopropyl) triethoxysilane-coated magnetite nanoparticles", Journal of Magnetism and Magnetic Materials, vol. 279, Issues 2-3, Aug. 2004, pp. 210-217, ScienceDirect.com (online), Elsevier B.V., Amsterdam.

\* cited by examiner

SELF-HEATING SOLDER FLUX MATERIAL

BACKGROUND

A "no-clean" solder flux material is a flux that is designed to be sufficiently volatile or that undergoes thermal decomposition to volatile products such that a cleaning step may not be necessary to remove flux and associated residues after a soldering operation. In some cases, a no-clean solder flux material may cause electrical failures when the solder flux material does not reach sufficiently high temperatures to completely volatilize a solvent carrier and to convert dicarboxylic acids to a clear, glassy state. If the solvent carrier is not completely volatilized, the solder flux material may remain in a resin-like state, enabling movement of ions and potentially resulting in electrochemical migration or dendrite formation.

The aforementioned issues associated with no-clean solder flux material may be particularly problematic in hand soldering and rework operations, in which the entire printed circuit board is not exposed to solder reflow temperatures. For instance, during a rework operation, solder flux material may move into other areas on the printed circuit board that are adjacent to the rework region. When the rework region is heated during soldering, distal areas where the solder flux material has moved may not reach solder reflow temperatures. Due to insufficient heating, the solder flux material in such distal areas may not be able to attain its glassy state, potentially resulting in corrosion and/or electrical failures. Additionally, entrapment of solder flux material beneath electrical components may also be problematic due to the additional time required for the solvent carrier to escape.

SUMMARY

According to an embodiment, a self-heating solder flux material is disclosed. The self-heating solder flux material includes a solder flux material and a multi-compartment microcapsule. The solder flux material includes a solvent carrier, and the multi-compartment microcapsule includes a first compartment, a second compartment, and an isolating structure. The first compartment contains a first reactant, and the second compartment contains a second reactant. The isolating structure separates the first compartment from the second compartment. The isolating structure is adapted to rupture in response to a stimulus. Rupture of the isolating structure results in an exothermic reaction between the first reactant and the second reactant. The exothermic reaction generates heat to volatilize the solvent carrier.

According to another embodiment, a self-heating solder flux material is disclosed. The self-heating solder flux material includes a solder flux material that includes a solvent carrier and a shell-in-shell microcapsule. The shell-in-shell microcapsule includes an inner shell within an outer shell. The inner shell encapsulates a first compartment that contains a first reactant. The outer shell encapsulates a second compartment that contains a second reactant. The inner shell defines an isolating structure that separates the first compartment from the second compartment. The isolating structure is adapted to rupture in response to exposure to a magnetic field, ultraviolet (UV) light, or a combination thereof. Rupture of the isolating structure results in an exothermic reaction between the first reactant and the second reactant that generates heat to volatilize the solvent carrier.

According to another embodiment, a process of utilizing a self-heating solder flux material is disclosed. The process includes applying a self-heating solder flux material to a region of a printed circuit board. The self-heating solder flux material includes a solder flux material that includes a solvent carrier and a multi-compartment microcapsule. The multi-compartment microcapsule includes a first compartment, a second compartment, and an isolating structure. The first compartment contains a first reactant, the second compartment contains a second reactant, and the isolating structure separates the first compartment from the second compartment. The process also includes performing a soldering operation at the region of the printed circuit board. The process further includes exposing the printed circuit board to a stimulus after performing the soldering operation. The isolating structure of the multi-compartment microcapsule is adapted to rupture in response to the stimulus. Rupture of the isolating structure results in an exothermic reaction between the first reactant and the second reactant that generates heat to volatilize the solvent carrier.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
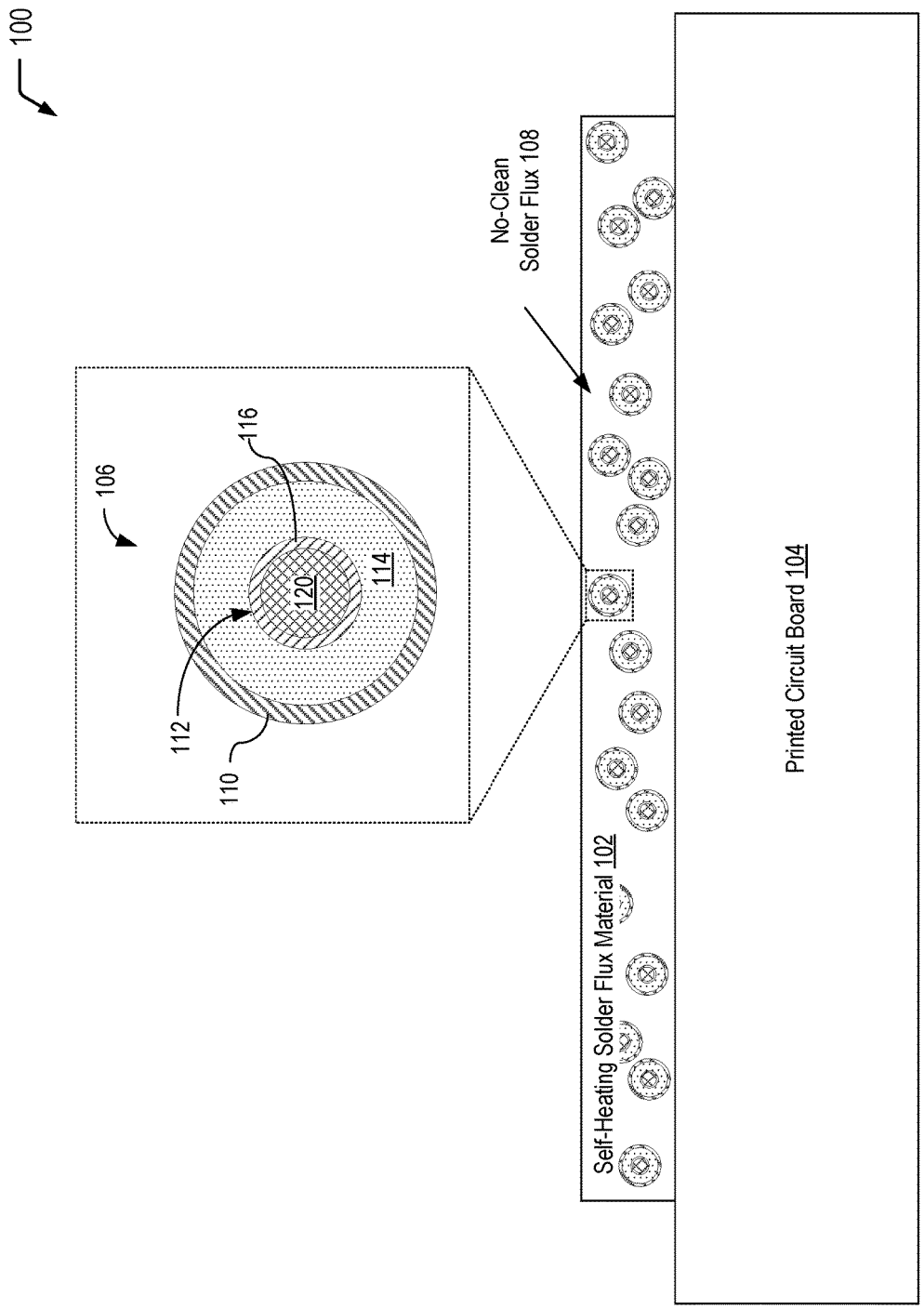
FIG. 1 is a diagram of a self-heating solder flux material that includes multi-compartment microcapsules that release heat when exposed to a stimulus, according to one embodiment.

The present disclosure describes self-heating solder flux materials having heat generating microcapsules that are dispersed within a solder flux material (e.g., a no-clean solder flux material) and processes for producing such self-heating solder flux materials. The multi-compartment microcapsules of the present disclosure produce heat when subjected to a stimulus, such as a magnetic field, an appropriate wavelength of ultraviolet (UV) light, or a combination thereof. The heat-generating microcapsules can be triggered to release heat after a printed circuit board has been processed to ensure that solder flux residue reaches a sufficient temperature to volatilize remaining solvent carrier, thereby reducing risk of electrochemical migration and electrical failures associated with conventional no-clean solder flux materials.

The multi-compartment microcapsules of the present disclosure may have first and second compartments separated by an isolating structure adapted to rupture in response to a stimulus. The first and second compartments contain reactants that come in contact and react to produce heat when the isolating structure ruptures. In some embodiments, the multi-compartment microcapsules are shell-in-shell microcapsules each having an inner shell contained within an outer shell. The inner shell defines the isolating structure, and the outer shell does not allow the heat-generating chemistry to escape the microcapsule upon rupture of the inner shell.

In the present disclosure, the inner shell of the multi-compartment microcapsules may be triggered to degrade with exposure to a magnetic field and/or actinic radiation (e.g., an appropriate wavelength of UV light), resulting in mixing of reactants such as iron and hydrogen peroxide (among other possible reactants) and inducing a heat generating reaction. During rupture of the inner shell, the outer shell of the microcapsule remains intact to prevent the inner contents from contacting the printed circuit board.

In some cases, magnetic particles (e.g., $Fe_3O_4$ particles, also referred to as magnetite particles) may be embedded into the inner shell such that when the no-clean solder flux material is exposed to a magnetic field, the magnetic particles dislodge from the inner shell resulting in pores for the iron and hydrogen peroxide to mix and generate heat. Instead of, or in addition to the magnetic particles, the inner shell material may include a UV-sensitive material such that, when exposed to UV light, the UV-sensitive material degrades. The degradation of the inner shell material results in mixing of the iron and hydrogen peroxide, generating heat. The inner shell may be cross-linked via actinic radiation (e.g., UV light) or may undergo a reversible 2+2 photoaddition reaction. Exposure to an appropriate wavelength of UV light facilitates the reverse reaction, thereby opening the inner shell and enabling the exothermic reaction to generate heat. If the inner shell is to be UV-sensitive, the outer shell is formed from a material that is transparent to the particular wavelength(s) of UV light that facilitate the reverse reaction.

The heat-generating microcapsules may be dispersed in a no-clean solder flux material, with the resulting mixture referred to herein as a self-heating solder flux material. The self-heating solder flux material may be applied to one or more regions of a printed circuit board where soldering operation(s) are to be performed. After performing the soldering operation(s), the printed circuit board may be exposed to a magnetic field and/or UV light to trigger the inner shell of the microcapsules to rupture, releasing heat and volatilizing any remaining solvent carrier. As a result, the resulting flux residues on the printed circuit board are in the benign state, thereby reducing the risk of electrochemical migration and electrical failures.

Referring to FIG. 1, a diagram 100 illustrates an example of a self-heating solder flux material 102 that may be applied to selected region(s) of a printed circuit board 104 (e.g., during a hand soldering operation or a rework operation). FIG. 1 illustrates that the self-heating solder flux material 102 includes multi-compartment microcapsules 106 dispersed in a no-clean solder flux 108. As described further herein with respect to FIGS. 2 and 3, after performing soldering operation(s) in the selected region(s) of the printed circuit board 104, the multi-compartment microcapsules 106 may be activated via exposure to a magnetic field, to UV light, or a combination thereof. Exposure to a magnetic field and/or UV light results in degradation of an inner shell material separating an inner compartment from an outer compartment, allowing reactants to mix and undergo a heat generating reaction. A sufficient amount of the microcapsules 106 may be incorporated into the self-heating solder flux material 102, such that flux residue reaches a sufficient temperature to volatilize any remaining solvent carrier associated with the no-clean solder flux 108. As a result, the resulting flux residues on the printed circuit board 104 are in the benign state, thereby reducing the risk of electrochemical migration and electrical failures.

In FIG. 1, a single multi-compartment microcapsule 106 that is dispersed in the self-heating solder flux material 102 is illustrated in a cutaway view. The multi-compartment microcapsule 106 has a shell-in-shell architecture with an inner shell contained within an outer shell. It will be appreciated that numerous multi-compartment microcapsules having a structure similar to the multi-compartment microcapsule 106 depicted in FIG. 1 may be dispersed in the self-heating solder flux material 102. The multi-compartment microcapsule 106 has an outer wall 110 (also referred to herein as the "outer shell" of the multi-compartment microcapsule 106) and contains an inner microcapsule 112 and a first reactant 114. The inner microcapsule 112 has a capsule wall 116 (also referred to herein as the "inner shell" of the multi-compartment microcapsule 106) and contains a second reactant 120. The first reactant 114 within the multi-compartment microcapsule 106 may surround the inner microcapsule 112, and the first reactant 114 may be prevented from contacting the second reactant 120 by the capsule wall 116 of the inner microcapsule 112.

Figure 2:
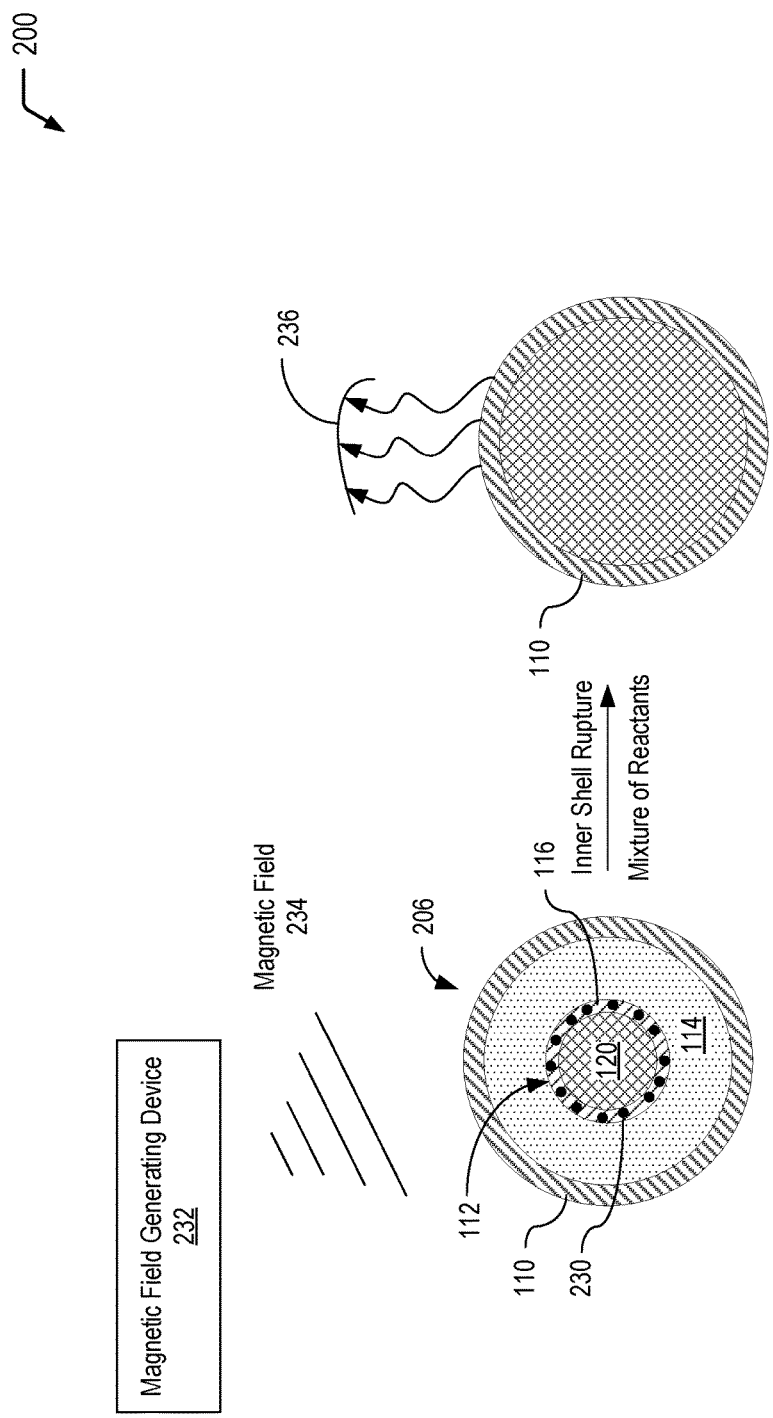
FIG. 2 is a diagram of a multi-compartment microcapsule having an inner shell that is adapted to rupture when exposed to a magnetic field, according to an embodiment.

While not shown in the example of FIG. 1, in some embodiments (e.g., as depicted in FIG. 2), magnetic nanoparticles (e.g., magnetite particles) may be incorporated into the inner shell 116 of the multi-compartment microcapsule 106. As illustrated and further described herein with respect to the embodiment depicted in FIG. 2, a magnetic field generating device 232 may be used to generate a magnetic field 234 that is sufficient to rupture the inner shell 116 of the multi-compartment microcapsule 106 via magnetic stimulation of the magnetic nanoparticles. Application of a sufficiently strong high-frequency magnetic field causes the magnetic nanoparticles to rotate and/or vibrate at an accelerated rate thereby rupturing the inner shell 116 and, in turn, permitting the first reactant 114 and the second reactant 120 to contact one another, react, and generate heat.

Figure 3:
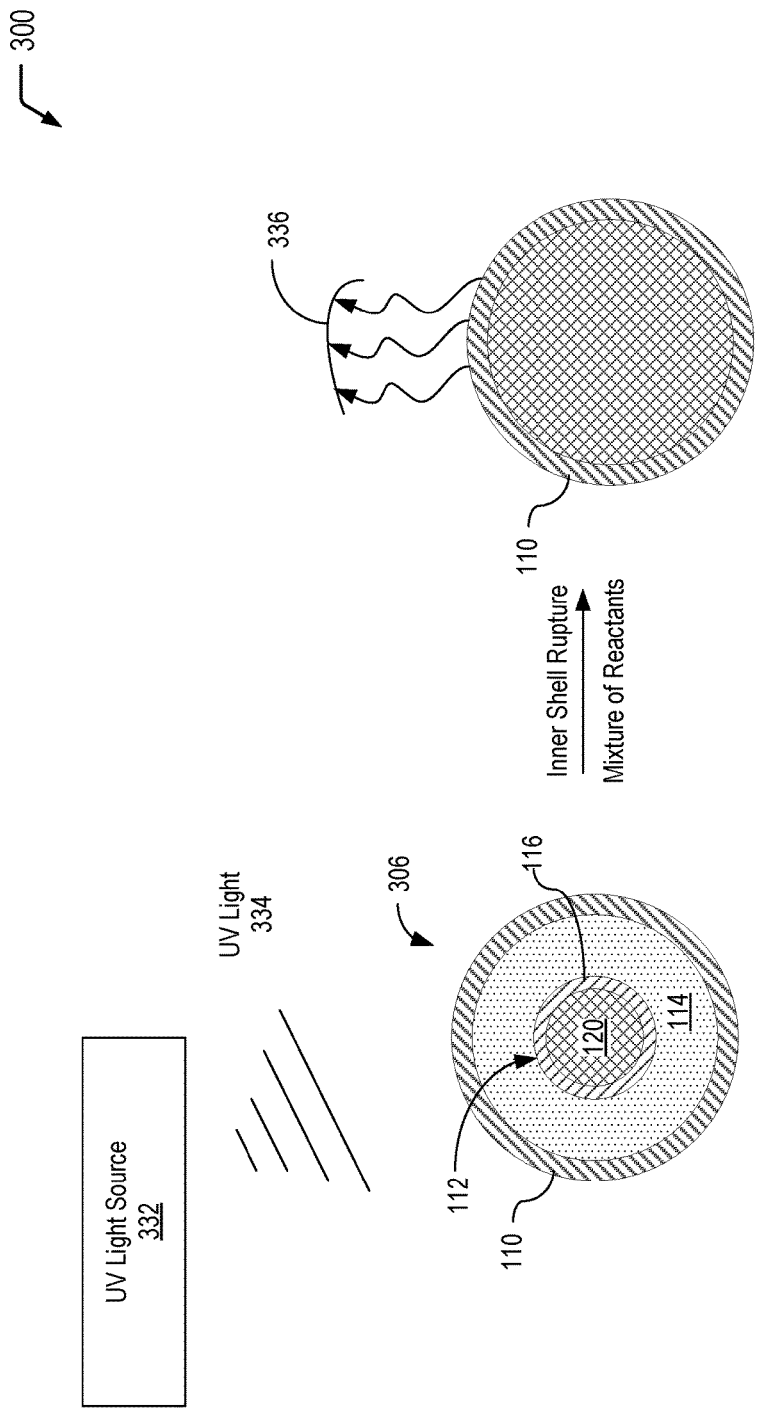
FIG. 3 is a diagram of a multi-compartment microcapsule having an inner shell that is adapted to rupture as a result of a photochemical reaction, according to an embodiment.

In another embodiment, the inner shell 116 of the multi-compartment microcapsule 106 may be formed from a UV-sensitive material that degrades in response to exposure to an appropriate wavelength of UV light, as illustrated and further described herein with respect to FIG. 3. In yet another embodiment, the inner shell 116 of the multi-compartment microcapsule 106 may include magnetic nanoparticles dispersed in a UV-sensitive material, and the inner shell 116 may be adapted to rupture in response to exposure to either a magnetic field or an appropriate wavelength of UV light (or a combination thereof).

In accordance with some embodiments of the present disclosure, the self-heating solder flux material 102 of FIG. 1 may utilize a multi-compartment microcapsule containing an oxidizing and a reducing agent to produce an exothermic reaction, such as oxygen and iron, respectively, according to the reaction equation:

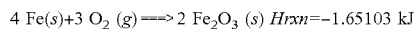

$$4\ Fe(s) + 3\ O_2\ (g) \Longrightarrow 2\ Fe_2O_3\ (s)\ Hrxn = -1.65103\ kJ$$

According to the reaction equation, 4 moles of iron react with 3 moles of oxygen, such that in an embodiment iron may comprise 53% of the combined mass of the two reactants and oxygen may comprise 43% of that combined mass. In an additional embodiment, a multi-compartment microcapsule may contain iron powder and hydrogen peroxide. The iron powder may be mixed with a catalyst such as ferric nitrate, which when in contact with the hydrogen peroxide, liberates oxygen to react exothermically with the iron powder. For example, the multi-compartment microcapsule may use 1.5 moles of hydrogen peroxide per mole of iron, for example 0.56 grams of iron powder to 0.51 grams of hydrogen peroxide. The catalytic amount of ferric nitrate may be chosen to achieve a desired reaction rate of heating, in kilojoules per second. For example, between 0.001 and 0.005 gram equivalents of ferric nitrate per liter of hydrogen peroxide results in a reaction rate producing heat at between 100 and 500 kilojoules per second.

In a particular embodiment, the multi-compartment microcapsule 106 may contain a mixture of iron powder and ferric nitrate in the inner microcapsule 112 as the second reactant 120 and may contain hydrogen peroxide as the first reactant 114 surrounding the inner microcapsule 112. Alternatively, the multi-compartment microcapsule 106 may contain hydrogen peroxide in the inner microcapsule 112 as the second reactant 120 and may contain a mixture of iron powder and ferric nitrate as the first reactant 114 surrounding the inner microcapsule 112. In some embodiments, the multi-compartment microcapsule 106 may have a diameter of less than 5.0 microns, or the multi-compartment microcapsule 106 may have a diameter of less than 2.0 microns.

In a particular embodiment, a no-clean solder flux material includes a dicarboxylic acid, an organic solvent (also referred to herein as a "solvent carrier"), and acetic acid. In some cases, the organic solvent may include isopropyl alcohol (also referred to as IPA). As previously described herein, conventional no-clean solder flux materials may cause electrical failures when the flux does not reach sufficiently high temperatures to volatilize the solvent carrier (e.g., IPA in this example) and convert the dicarboxylic acid to a clear glassy state. If the solvent carrier is not completely volatilized, the flux does not reach the benign, glassy state, enabling movement of ions and potentially resulting in electrochemical migration or dendrite formation.

Accordingly, the self-heating solder flux material 102 of the present disclosure may include a sufficient number of multi-compartment microcapsules 106 to ensure that the solvent carrier of the no-clean solder flux material is completely volatilized. In the case of a no-clean solder flux material that includes IPA as the solvent carrier, the weight percentage of the multi-compartment microcapsules 106 may be sufficient for the self-heating solder flux material 102 to reach a temperature of at least 82.6° C. (the boiling point of isopropyl alcohol). In some cases, the weight percentage of the multi-compartment microcapsules 106 may be sufficient for the self-heating solder flux material 102 to completely volatilize the solvent carrier but insufficient to reach a solder reflow temperature (e.g., about 265° C., in some cases). Thus, in a particular embodiment where the solvent carrier includes IPA, the weight percentage of the multi-compartment microcapsules 106 may be sufficient for the self-heating solder flux material 102 to reach a temperature that is in a range of 82.6° C. to 265° C., such as in a range of 85° C. to 250° C.

As an illustrative example, assuming 30 grams of sealant is used for an encapsulation application and further assuming a loading level of 2 weight percent of heat-generating microcapsules yields 0.6 grams of capsules. To achieve a suitable stoichiometry, 57% of capsules may be loaded with finely divided iron powder, and 43% may be loaded with an oxidizer, yielding 0.342 grams of Fe. Based on the exothermic reaction of iron and oxygen previously described herein, 250 grams of Fe would yield 1841 kJ, and oxidation of this mass of iron particles liberates 2.518 kJ. As an approximation, 30 grams (0.03 kg) of sealant may require 0.03 kJ to raise its temperature by 1° C. (1.00 kJ/kg C*0.03 kg=0.03 kJ/C). Assuming that the heat capacity of the sealant is equivalent to the heat capacity of an epoxy cast resin, the heat of reaction in this example would be sufficient to raise the temperature of the 30 g of sealant by about 84° C. (2.518 kJ/0.03 kJ/C=83.9° C.). Depending on the desired temperature increase, the loading level and/or stoichiometry may be adjusted accordingly.

A structure similar to the multi-compartment microcapsule 106 of FIG. 1, including the various embodiments thereof, may operate similarly to the microcapsules 206 and 306 of FIGS. 2 and 3 to rupture the inner shell 116, mix the reactants 114 and 120, and produce heat from an exothermic reaction of the reactants. It would be further apparent to one of ordinary skill in the art that an exothermic reaction may be produced by more than two reactants, and that more than two reactants within a capsule may be isolated by more than one inner capsule or membrane, or more than one of any other form of barrier isolating the reactants within the capsule. A variety of reactants may be substituted to produce an exothermic reaction, or a variety of reaction rates and total heat produced, in accordance with some embodiments of the present disclosure.

Thus, FIG. 1 illustrates an example of a self-heating solder flux material that includes multi-compartment microcapsules having an inner shell that is adapted to rupture in response to exposure to a magnetic field, UV light, or a combination thereof. The rupture of the inner shell allows the reactants to mix and undergo an exothermic chemical reaction, thereby generating heat. The heat generated by the microcapsules may volatilize residual solvent carrier in a no-clean solder flux material in order to allow the no-clean solder flux material to reach a glassy, benign state.

Referring to FIG. 2, a diagram 200 depicts an example of a multi-compartment microcapsule 206 having an inner shell 116 that is adapted to rupture in response to exposure to a magnetic field. In some embodiments, the multi-compartment microcapsule 206 of FIG. 2 may correspond to the multi-compartment microcapsule 106 of FIG. 1. While not shown in FIG. 2, the multi-compartment microcapsule 206 may be dispersed in the self-heating solder flux material 102 depicted in FIG. 1. In FIG. 2, the multi-compartment microcapsule 206 includes magnetic nanoparticles 230 dispersed in the inner shell 116. As illustrated and further described herein with respect to FIG. 5, the inner shell 116 of the inner microcapsule 112 of the multi-compartment microcapsule 206 depicted in FIG. 2 may be formed with magnetic nanoparticles 230 adapted to rupture as a result of magnetic stimulation of the magnetic nanoparticles 230.

In FIG. 2, a magnetic field generating device 232 may be configured to generate a magnetic field 234. FIG. 2 illustrates that exposure of the multi-compartment microcapsule 206 to the magnetic field 234 results in the magnetic nanoparticles 230 being dislodged from the inner shell 116, thereby creating pores for the first reactant 114 (e.g., hydrogen peroxide) and the second reactant 120 (e.g., iron) to mix and generate heat 236. As an example, the inner shell 116 may be an inner polymeric shell, and the magnetic nanoparticles 230 may include magnetite ($Fe_3O_4$) particles that are incorporated into the inner polymeric shell. In some embodiments, the inner shell 116 may be formed from a UV-sensitive material, as described further herein with respect to FIG. 3. In this case, the inner shell 116 may rupture as a result of exposure to the magnetic field 234 and/or an appropriate wavelength of UV light. The outer wall 110 of the multi-compartment microcapsule 206 may be formed so as to not rupture when exposed to the magnetic field 234. In some embodiments, the outer wall 110 may be formed from a UV-transparent material in order to allow UV light to reach the inner shell 116, as described further herein with respect to FIG. 3.

In a particular embodiment, the magnetic field 234 applied to the self-heating solder flux material 102 by the magnetic field generating device 232 is a high-frequency magnetic field having a frequency of approximately 50-100 Hz and a strength of approximately 2.5 kA/m or 31 Oe. The multi-compartment microcapsule 206 depicted in FIG. 2 may be exposed to the magnetic field 234 after performing soldering operation(s) at region(s) of the printed circuit board 104 where the no-clean solder flux 108 has been applied.

The right side of FIG. 2 further illustrates that, after exposure to the magnetic field 234, the reactants 112, 114 have come into contact and have reacted exothermically to produce heat 236. The heat 236 may transfer through the outer shell 110 to a material in which the multi-compartment microcapsule 206 is dispersed (e.g., the self-heating solder flux material 102 of FIG. 1). The heat 236 may volatilize residual solvent carrier (e.g., isopropyl alcohol) in the self-heating solder flux material 102 such that the no-clean solder flux 108 may reach the glassy, benign state.

Thus, FIG. 2 illustrates an example of a multi-compartment microcapsule that includes magnetic nanoparticles in an inner shell. Exposure of the multi-compartment microcapsule of FIG. 2 to a magnetic field results in rupture of the inner shell, mixing of the reactants, and an exothermic chemical reaction. The heat generated by the exothermic chemical reaction may volatilize residual solvent carrier that may remain on the printed circuit board after the soldering operation(s). Removal of the residual solvent carrier allows the no-clean solder flux to reach the glassy, benign state in order to prevent movement of ions and potential electrochemical migration or dendrite formation that may be associated with conventional no-clean solder flux.

Referring to FIG. 3, a diagram 300 depicts an example of a multi-compartment microcapsule 306 having an inner shell 116 that is adapted to rupture in response to exposure to UV light. In some embodiments, the multi-compartment microcapsule 306 of FIG. 3 may correspond to the multi-compartment microcapsule 106 of FIG. 1. While not shown in FIG. 3, the multi-compartment microcapsule 306 may be dispersed in the self-heating solder flux material 102 depicted in FIG. 1. As illustrated and further described herein with respect to FIG. 6, the inner shell 116 of the multi-compartment microcapsule 306 of FIG. 3 may be formed from a UV-sensitive material that degrades when exposed to an appropriate wavelength of UV light. Further, in order for the inner shell 116 to be exposed to the UV light, the outer shell 110 may be formed from a UV-transparent material.

In FIG. 3, a UV light source 332 may be configured to generate UV light 334 at appropriate wavelength(s) that may be determined based on the particular UV-sensitive material(s) that are used to form the inner shell 116. Illustrative, non-limiting examples of UV-sensitive materials that may be used to form the inner shell 116 may include a nitrocinnamate-based material or an azobenzene-based material, among other alternatives (such as the photodimers depicted in FIG. 4). In the case of the photodimers depicted in FIG. 4, the wavelength of the UV light 334 may be less than 240 nm in order to trigger retro-dimerization. Similarly, appropriate UV wavelengths may be selected for other UV-sensitive materials such as nitrocinnamate or azobenzene.

FIG. 3 illustrates that exposure of the multi-compartment microcapsule 306 to the UV light 334 initiates a photochemical reaction that results in degradation of the inner shell 116. Degradation of the inner shell 116 enables the first reactant 114 (e.g., hydrogen peroxide) and the second reactant 120 (e.g., iron) to mix and generate heat 236. In some embodiments, while not shown in FIG. 3, the inner shell 116 may also include magnetic nanoparticles, as previously described herein with respect to FIG. 2. In this case, the inner shell 116 may rupture as a result of exposure to a magnetic field and/or an appropriate wavelength of UV light. The outer wall 110 of the microcapsule 306 may be formed so as to not rupture when exposed to the UV light 334. In order to allow the UV light 334 to reach the inner shell 116, the outer wall 110 may be formed from a UV-transparent polymeric material. Illustrative, non-limiting examples of UV-transparent polymeric materials include polydimethylsiloxane (PDMS), cyclic olefin copolymers, and perfluoropolymers (among other alternatives). Perfluoropolymers can be formed from various monomers, including: 1H,1H,2H,2H-Perfluorodecyl methacrylate; 1H,1H,2H,2H-Nonafluorohexyl-l-methacrylate; 1H,1H,2H,2H-Tridecafluorooctyl-1-methacrylate; 1H,1H,2H,2H-Tridecafluorooctyl acrylate; 2-Perfluorobutylethyl acrylate; and 2,2,3,4,4,4-Hexafluorobutyl methacrylate. Alternatively, conventional urea-based microcapsule materials may also be UV-transparent and, in some embodiments, may be utilized to form the UV-transparent polymeric material.

The right side of FIG. 3 further illustrates that, after exposure to the UV light 334, the reactants 112, 114 have come into contact and have reacted exothermically to produce heat 336. The heat 336 may transfer through the outer shell 110 to a material in which the microcapsule 306 is dispersed (e.g., the self-heating solder flux material 102 of FIG. 1). The heat 336 may volatilize residual solvent carrier (e.g., isopropyl alcohol) in the self-heating solder flux material 102 such that the no-clean solder flux 108 may reach the glassy, benign state.

Thus, FIG. 3 illustrates an example of a multi-compartment microcapsule having an inner shell that includes a UV-sensitive material and a UV-transparent outer shell. Exposure of the multi-compartment microcapsule to FIG. 3 to an appropriate wavelength of UV light results in rupture of the inner shell, mixing of the reactants, and an exothermic chemical reaction. The heat generated by the exothermic chemical reaction may volatilize residual solvent carrier that may remain on the printed circuit board after the soldering operation(s). Removal of the residual solvent carrier allows the no-clean solder flux to reach the glassy, benign state in order to prevent movement of ions and potential electrochemical migration or dendrite formation that may be associated with conventional no-clean solder flux.

Figure 4:
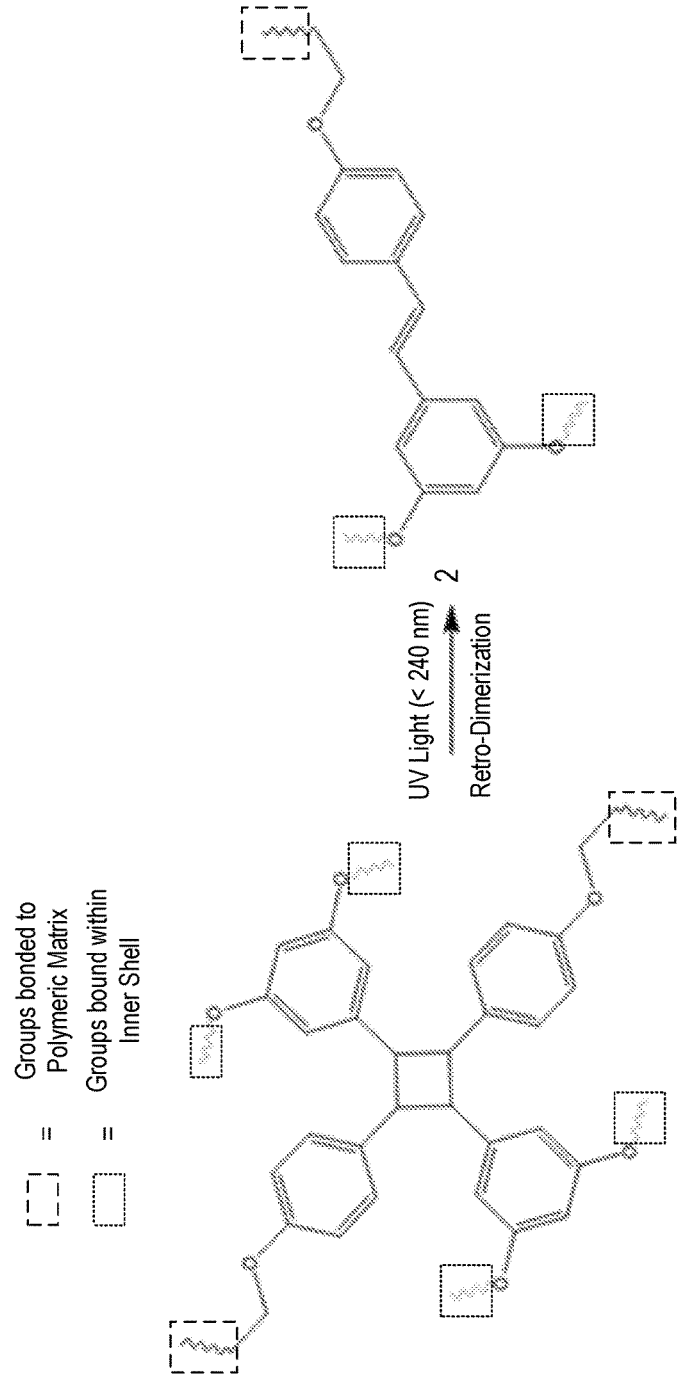
FIG. 4 is a chemical reaction diagram illustrating a process of retro-dimerization that results in rupture of an inner shell of a multi-compartment microcapsule and associated release of the encapsulated reactant, according to one embodiment.

Referring to FIG. 4, a chemical reaction diagram 400 depicts an example of a process of retro-dimerization resulting from exposure to UV light. When the inner shell 116 is formed from the material depicted on the left side of the chemical reaction diagram 400, exposure to a particular wavelength of UV light results in the retro-dimerization reaction, rupture of the inner shell 116 and associated release of the second reactant 120.

The left side of the chemical reaction diagram 400 illustrates that, prior to exposure to UV light, a first portion of the orthogonal groups are bound within the inner shell 116 and a second portion of the orthogonal groups are bound to a polymeric matrix material. The right side of the chemical reaction diagram 400 illustrates that UV light (e.g., at a wavelength that is less than 240 nm) results in a retro-dimerization reaction. The retro-dimerization of the resveratrol-containing groups may result in rupture of the inner shell 116 and the associated release of the second reactant 120 that is encapsulated within the inner microcapsule 112.

Figure 5:
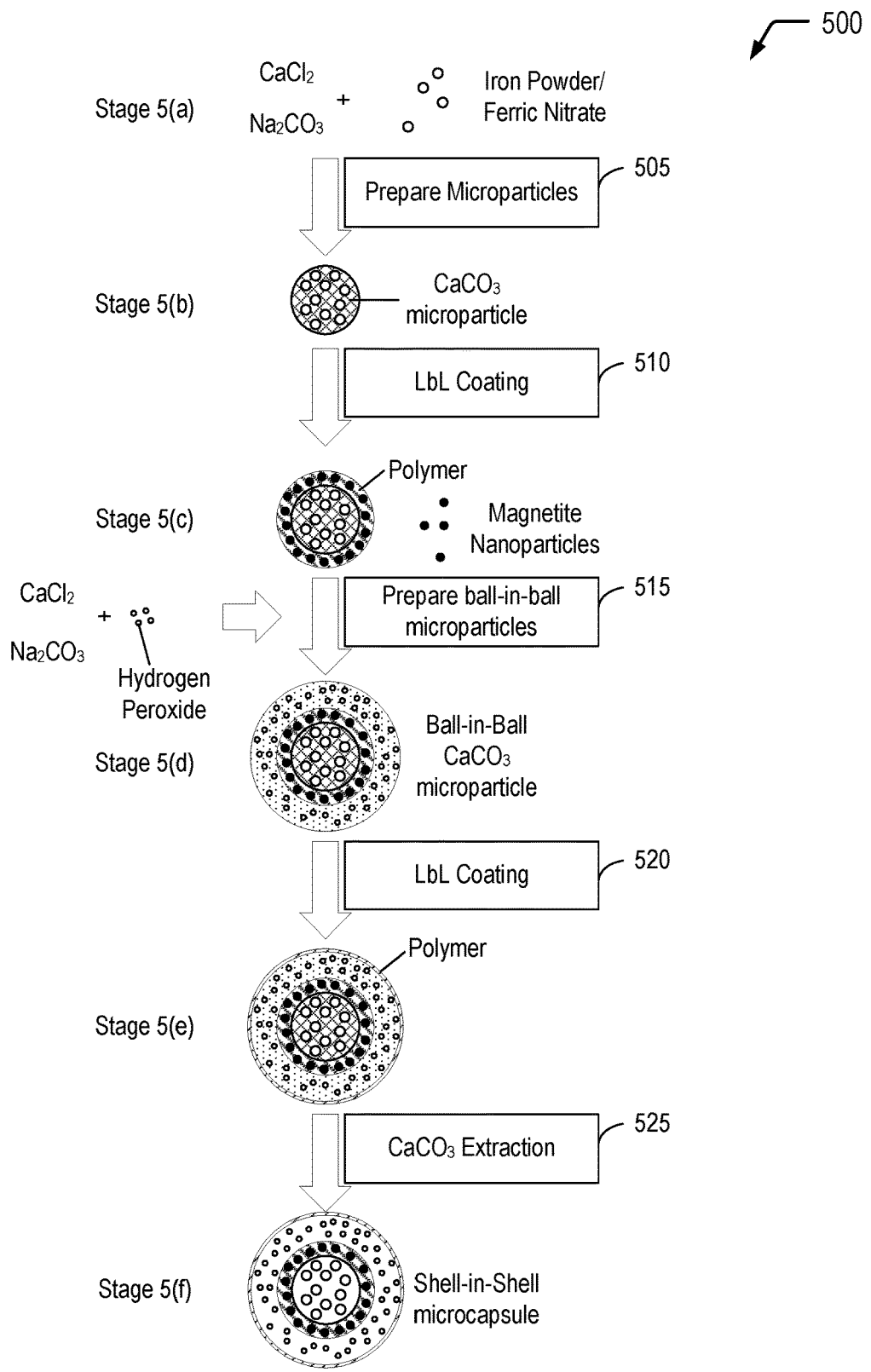
FIG. 5 is a flow diagram showing a process of forming a multi-compartment microcapsule having an inner shell adapted to rupture when exposed to a magnetic field, according to an embodiment.

FIG. 5 is a flow diagram illustrating, through stages 5(a)-5(f), a method 500 of producing a multi-compartment microcapsule having a shell-in-shell architecture with an inner shell contained within an outer shell, wherein the inner shell is adapted to rupture in response to a magnetic field according to some embodiments of the present disclosure. In the method 500, the steps discussed below (steps 505-525) are performed. These steps are set for the in their preferred order. It must be understood, however, that the various steps may occur simultaneously or at other times relative to one another. Moreover, those skilled in the art will appreciate that one or more steps may be omitted.

In each of the stages 5(a)-5(f), the structure is shown in a cross-sectional side view. The method 500 is a modified version of the shell-in-shell microcapsule concept disclosed in Kreft et al., "Shell-in-Shell Microcapsules: A Novel Tool for Integrated, Spatially Confined Enzymatic Reactions", Angewandte Chemie International Edition, Vol. 46, 2007, pp. 5605-5608, which is hereby incorporated herein by reference in its entirety.

The method 500 begins by preparing spherical calcium carbonate microparticles in which finely powdered iron is immobilized by coprecipitation (step 505). Optionally, a catalyst such as ferric nitrate may be immobilized in the spherical calcium carbonate microcapsules as well as the iron powder. For example, 1M $CaCl_2$ (0.615 mL), 1M $Na_2CO_3$ (0.615 mL), and deionized water (2.450 mL) containing finely powdered iron (2 mg) and, optionally, $Fe(NO_3)_3$ (0.01 mg) may be rapidly mixed and thoroughly agitated on a magnetic stirrer for 20 seconds at room temperature. After the agitation, the precipitate may be separated from the supernatant by centrifugation and washed three times with water. One of the resulting $CaCO_3$ microparticles is shown at stage 5(b).

The diameter of the $CaCO_3$ microparticles produced with a reaction time of 20 s is 4-6 μm. Smaller $CaCO_3$ microparticles are produced if the reaction time is reduced from 20 s to several seconds.

One skilled in the art will appreciate that other metals may be used in lieu of, or in addition to, the iron powder. For example, magnesium or magnesium-iron alloy may also be used.

As noted above, the iron powder may be mixed with a catalyst such as ferric nitrate, which when in contact with the hydrogen peroxide (to be encapsulated in the outer shell) liberates oxygen to react exothermically with the iron powder. One skilled in the art will appreciate that other catalysts may be used in lieu of, or in addition to, the ferric nitrate. For example, sodium iodide (NaI) may also be used.

Magnetic nanoparticles are used in step 510 for incorporation into the "inner shell" polyelectrolyte multilayer (i.e., the "Polymer" shown at stage 5(c)). Magnetic nanoparticles are incorporated into the "inner shell" polyelectrolyte multilayer for the purpose of adapting the inner shell of the shell-in-shell microcapsule to rupture in response to a magnetic field. The shell-in-shell microcapsule that results from this incorporation of magnetic nanoparticles into the inner shell corresponds to the multi-compartment microcapsule 206 shown in FIG. 2.

The magnetic nanoparticles may be, for example, $Fe_3O_4$ (also referred to as "magnetite") nanoparticles, cobalt ferrite nanoparticles, or other magnetic nanoparticles known in the art. Preferably, the magnetic nanoparticles have a diameter in the range of approximately 6-25 nm. One skilled in the art will appreciate that other magnetic nanoparticles may be used in lieu of, or in addition to, the magnetite. For example, cobalt ferrite nanoparticles may also be used.

The magnetic nanoparticles may be prepared using conventional techniques known to those skilled in the art. For example, magnetite nanoparticles may be prepared using a conventional technique known as the "coprecipitation method." See, for example, the discussion of preparing magnetite nanoparticles using the coprecipitation method in the article to M. Yamaura et al., "Preparation and characterization of (3-aminopropyl) triethoxysilane-coated magnetite nanoparticles," Journal of Magnetism and Magnetic Materials, Vol. 279, pages 210-217, 2004, which is hereby incorporated herein by reference in its entirety.

An example of a conventional technique of preparing magnetite nanoparticles follows. This conventional example is based on an example set forth in the M. Yamaura et al. article. A 5 mol/l NaOH solution is added into a mixed solution of 0.25 mol/l ferrous chloride and 0.5 mol/l ferric chloride (molar ratio 1:2) until obtaining pH 11 at room temperature. The slurry is washed repeatedly with distilled water. Then, the resulting magnetite nanoparticles are magnetically separated from the supernatant and redispersed in aqueous solution at least three times, until obtaining pH 7. The M. Yamaura et al. article reports that a typical average diameter of the resulting magnetite nanoparticles is 12 nm.

In this example, the fabrication of polyelectrolyte capsules is based on the layer-by-layer (LbL) self-assembly of polyelectrolyte thin films. Such polyelectrolyte capsules are fabricated by the consecutive adsorption of alternating layer of positively and negatively charged polyelectrolytes onto sacrificial colloidal templates. Calcium carbonate is but one example of a sacrificial colloidal template. One skilled in the art will appreciate that other templates may be used in lieu of, or in addition to, calcium carbonate. For example, in accordance with other embodiments of the present disclosure, polyelectrolyte capsules may be templated on melamine formaldehyde and silica.

The method 500 continues by LbL coating the $CaCO_3$ microparticles (step 510). In step 510, a polyelectrolyte multilayer (PEM) build-up may be employed by adsorbing five bilayers of negative PSS (poly(sodium 4-styrenesulfonate); Mw=70 kDa) and positive PAH (poly(allylamine hydrochloride); Mw=70 kDa) (2 mg/mL in 0.5 M NaCl) by using the layer-by-layer assembly protocol. For example, the $CaCO_3$ microparticles produced in step 505 may be dispersed in a 0.5 M NaCl solution with 2 mg/mL PSS (i.e., polyanion) and shaken continuously for 10 min. The excess polyanion may be removed by centrifugation and washing with deionized water. Then, 1 mL of 0.5 M NaCl solution containing 2 mg/mL PAH (i.e., polycation) may be added and shaken continuously for 10 min. The excess polycation may be removed by centrifugation and washing with deionized water. This deposition process of oppositely charged polyelectrolyte may be repeated five times and, consequently, five PSS/PAH bilayers are deposited on the surface of the CaCO₃ microparticles. One of the resulting polymer coated CaCO₃ microparticles is shown at stage 5(*c*).

The thickness of this "inner shell" polyelectrolyte multilayer may be varied by changing the number of bilayers. Generally, it is desirable for the inner shell to rupture while the outer shell remains intact so that the reactants and the reaction products do not contaminate the solder flux material into which the multi-compartment microcapsule may be dispersed. Typically, for a given shell diameter, thinner shells rupture more readily than thicker shells. Hence, in accordance with some embodiments of the present disclosure, the inner shell is made relatively thin compared to the outer shell. On the other hand, the inner shell must not be so thin as to rupture prematurely.

The PSS/PAH-multilayer in step 510, is but one example of a polyelectrolyte multilayer. One skilled in the art will appreciate that other polyelectrolyte multilayers and other coatings may be used in lieu of, or in addition to, the PSS/PAH-multilayer in step 510. For example, coating polyelectrolyte multilayer capsules with lipids can result in a significant reduction of the capsule wall permeability.

The method 500 continues by preparing ball-in-ball calcium carbonate microparticles in which hydrogen peroxide is immobilized by a second coprecipitation (step 515). The ball-in-ball CaCO₃ microparticles are characterized by a polyelectrolyte multilayer that is sandwiched between two calcium carbonate compartments. In step 515, the polymer coated CaCO₃ microparticles may be resuspended in 1M CaCl₂ (0.615 mL), 1M Na₂CO₃ (0.615 mL), and deionized water (2.500 mL) containing hydrogen peroxide (1 mg), rapidly mixed and thoroughly agitated on a magnetic stirrer for 20 s at room temperature. After the agitation, the precipitate may be separated from the supernatant by centrifugation and washed three times with water. Unfortunately, the second coprecipitation is accompanied by formation of a coproduct, i.e., single core CaCO₃ microparticles that contain only hydrogen peroxide. Hence, the resulting precipitate represents a mixture of ball-in-ball CaCO₃ microparticles and single core CaCO₃ microparticles. The ball-in-ball CaCO₃ microparticles, which are magnetic due to the immobilized magnetite nanoparticles in the inner shell, may be isolated by applying an external magnetic field to the sample while all of the nonmagnetic single core CaCO₃ microparticles are removed by a few washing steps. One of the resulting ball-in-ball CaCO₃ microparticles is shown at stage 5(*d*).

One skilled in the art will appreciate that other oxidizers may be used in lieu of, or in addition to, the hydrogen peroxide. For example, water may also be used.

The method 500 continues by LbL coating the ball-in-ball CaCO₃ microparticles (step 520). In step 520, a polyelectrolyte multilayer (PEM) build-up may be employed by adsorbing five bilayers of negative PSS (poly(sodium 4-styrenesulfonate); Mw=70 kDa) and positive PAH (poly(allylamine hydrochloride); Mw=70 kDa) (2 mg/mL in 0.5 M NaCl) by using the layer-by-layer assembly protocol. For example, the ball-in-ball CaCO₃ microparticles produced in step 515 may be dispersed in a 0.5 M NaCl solution with 2 mg/mL PSS (i.e., polyanion) and shaken continuously for 10 min. The excess polyanion may be removed by centrifugation and washing with deionized water. Then, 1 mL of 0.5 M NaCl solution containing 2 mg/mL PAH (i.e., polycation) may be added and shaken continuously for 10 min. The excess polycation may be removed by centrifugation and washing with deionized water. This deposition process of oppositely charged polyelectrolyte may be repeated five times and, consequently, five PSS/PAH bilayers are deposited on the surface of the ball-in-ball CaCO₃ microparticles. One of the resulting polymer coated ball-in-ball CaCO₃ microparticles is shown at stage 5(*e*).

The thickness of this "outer shell" polyelectrolyte multilayer may be varied by changing the number of bilayers. Generally, it is desirable for the inner shell to rupture while the outer shell remains intact so that the reactants and the reaction products do not contaminate the solder flux material into which the multi-compartment microcapsule is dispersed. Typically, for a given shell diameter, thinner shells rupture more readily than thicker shells. Hence, in accordance with some embodiments of the present disclosure, the outer shell is made relatively thick compared to the inner shell.

The PSS/PAH-multilayer in step 520, is but one example of a polyelectrolyte multilayer. One skilled in the art will appreciate that other polyelectrolyte multilayers and other coatings may be used in lieu of, or in addition to, the PSS/PAH-multilayer in step 520. As noted above, coating polyelectrolyte multilayer capsules with lipids, for example, can result in a significant reduction of the capsule wall permeability.

The method 500 concludes with CaCO₃ extraction (step 525). In step 525, the CaCO₃ core of the ball-in-ball CaCO₃ microparticles may be removed by complexation with ethylenediaminetetraacetic acid (EDTA) (0.2 M, pH 7.5) leading to formation of shell-in-shell microcapsules. For example, the ball-in-ball CaCO₃ microparticles produced in step 520 may be dispersed in 10 mL of the EDTA solution (0.2 M, pH 7.5) and shaken for 4 h, followed by centrifugation and re-dispersion in fresh EDTA solution. This core-removing process may be repeated several times to completely remove the CaCO₃ core. The size of the resulting shell-in-shell microcapsules ranges from 8-10 μm and the inner core diameter is 3-5 μm. One of the resulting shell-in-shell microcapsules is shown at stage 5(*f*).

As noted above, the fabrication of polyelectrolyte capsules in method 500 is based on the layer-by-layer (LbL) self-assembly of polyelectrolyte thin films. One skilled in the art will appreciate that a multi-compartment microcapsule for heat generation in accordance with some embodiments of the present disclosure may be produced by other conventional multi-compartment systems, such as polymeric micelles, hybrid polymer microspheres, and two-compartment vesicles.

Thus, FIG. 5 illustrates an example of a process of forming a multi-compartment microcapsule having an inner shell adapted to rupture when exposed to a magnetic field. The multi-compartment microcapsule formed according to the process depicted in FIG. 5 may correspond to the multi-compartment microcapsule 206 illustrated and described further herein with respect to FIG. 2. The multi-compartment microcapsule formed according to the process depicted in FIG. 5 may represent a component of the self-heating solder flux material 102 depicted in FIG. 1. The microcapsules formed according to the process depicted in FIG. 5 can be triggered to release heat after a printed circuit board has been processed to ensure that solder flux residue reaches a sufficient temperature to volatilize remaining solvent carrier, thereby reducing risk of electrochemical migration and electrical failures associated with conventional no-clean solder flux materials.

Figure 6:
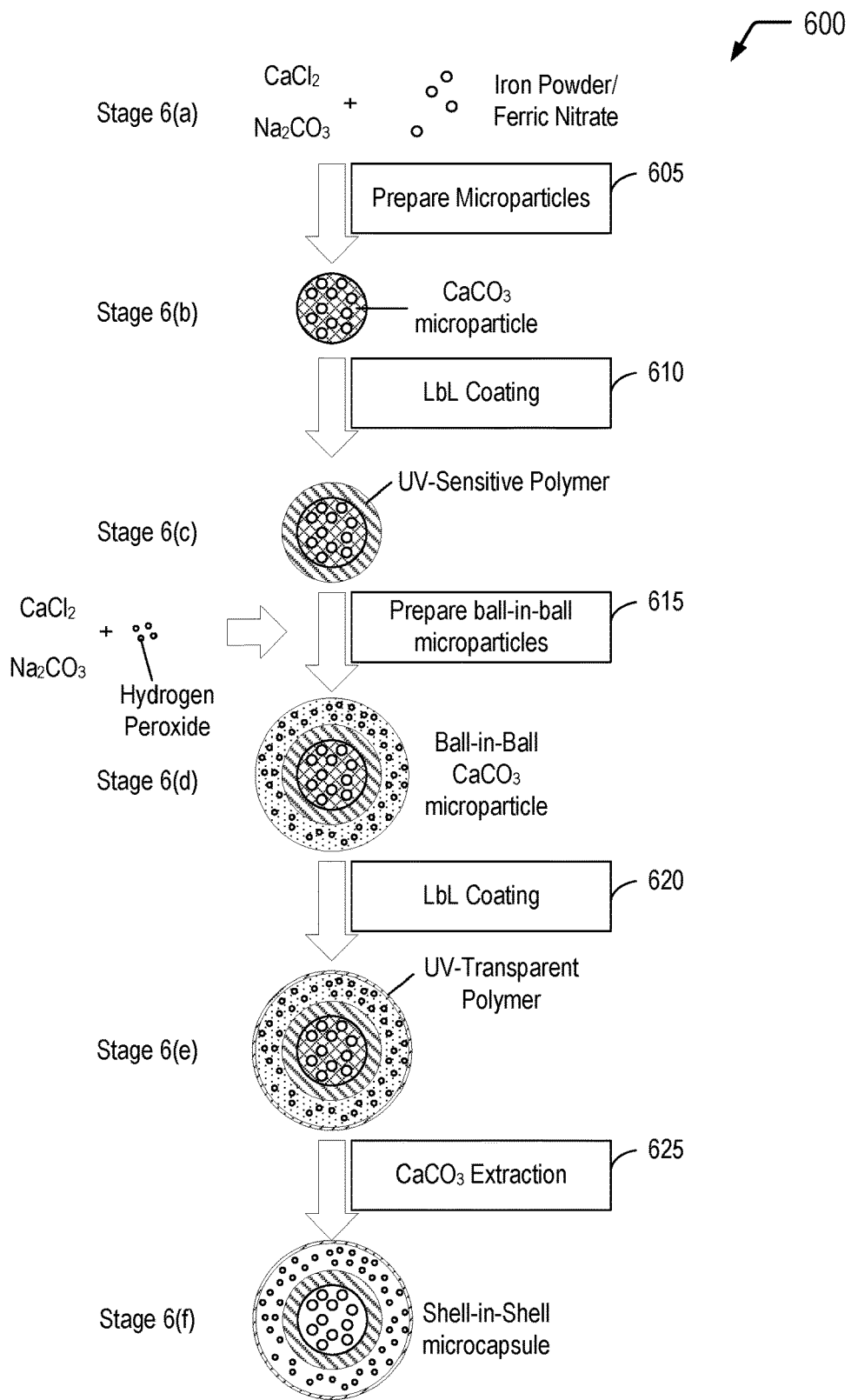
FIG. 6 is a flow diagram showing a process of forming a multi-compartment microcapsule having an inner shell adapted to rupture when exposed to an appropriate wavelength of ultraviolet (UV) light, according to an embodiment

FIG. 6 is a flow diagram illustrating, through stages 6(a)-6(f), a method 600 of producing a multi-compartment microcapsule having a shell-in-shell architecture with an inner shell contained within an outer shell, wherein the inner shell is adapted to rupture in response to exposure to an appropriate wavelength of UV light according to some embodiments of the present disclosure. In the method 600, the steps discussed below (steps 605-625) are performed. These steps are set for the in their preferred order. It must be understood, however, that the various steps may occur simultaneously or at other times relative to one another. Moreover, those skilled in the art will appreciate that one or more steps may be omitted.

In contrast to the method 500 depicted in FIG. 5, the method 600 of FIG. 6 does not illustrate the incorporation of magnetic nanoparticles into the inner shell material, as shown in Stage 6(c). Further, in contrast to the method 500 of FIG. 5, the method 600 of FIG. 6 utilizes a UV-sensitive polymer (which is optional in the method 500 of FIG. 5) for the inner shell polymer material, as shown at Stage 6(c). Still further, in contrast to the method 500 of FIG. 5, the method 600 of FIG. 6 utilizes a UV-transparent polymer (which is optional in the method 500 of FIG. 5) for the outer shell polymer material, as shown at Stage 6(e).

Thus, FIG. 6 illustrates an example of a process of forming a multi-compartment microcapsule having an inner shell adapted to rupture when exposed to an appropriate wavelength of UV light. The multi-compartment microcapsule formed according to the process depicted in FIG. 6 may correspond to the multi-compartment microcapsule 306 illustrated and described further herein with respect to FIG. 3. The multi-compartment microcapsule formed according to the process depicted in FIG. 6 may represent a component of the self-heating solder flux material 102 depicted in FIG. 1. The microcapsules formed according to the process depicted in FIG. 6 can be triggered to release heat after a printed circuit board has been processed to ensure that solder flux residue reaches a sufficient temperature to volatilize remaining solvent carrier, thereby reducing risk of electrochemical migration and electrical failures associated with conventional no-clean solder flux materials.

Figure 7:
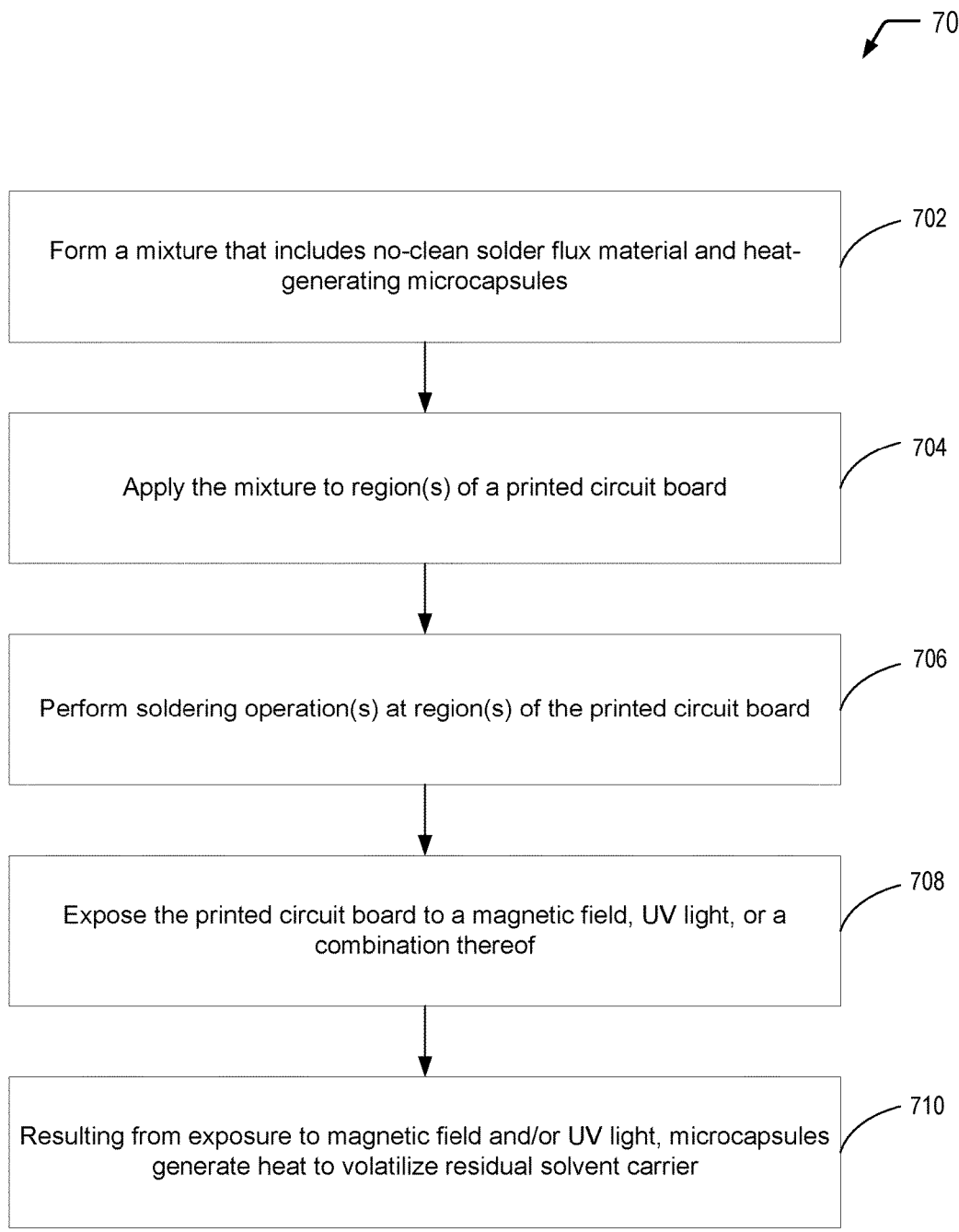
FIG. 7 is a flow diagram showing a process of utilizing the self-heating solder flux material of the present disclosure, according to one embodiment.

Referring to FIG. 7, a flow diagram illustrates a particular embodiment of a process 700 of utilizing the self-heating solder flux material of the present disclosure. In FIG. 7, the self-heating solder flux material (including multi-compartment microcapsules) is applied to region(s) of a printed circuit board (e.g., for hand soldering or rework operations). After the printed circuit board has been processed, the microcapsules can be triggered to release heat to ensure that solder flux residue reaches a sufficient temperature to volatilize remaining solvent carrier, thereby reducing risk of electrochemical migration and electrical failures associated with conventional no-clean solder flux materials.

The process 700 includes forming a mixture that includes no-clean solder flux material and heat-generating microcapsules, at 702. For example, referring to FIG. 1, the self-heating solder flux material 102 may be formed by mixing the microcapsules 106 into a no-clean solder flux 108. In some cases, the microcapsules 106 depicted in FIG. 1 may correspond to the microcapsules 206 depicted in FIG. 2, which may be triggered to release heat via exposure to a magnetic field. In other cases, the microcapsules 106 depicted in FIG. 1 may correspond to the microcapsules 306 depicted in FIG. 3, which may be triggered to release heat via exposure to UV light. In a particular embodiment, the no-clean solder flux 108 may include isopropyl alcohol as a solvent carrier.

The process 700 includes applying the mixture to one or more regions of a printed circuit board, at 704. For example, referring to FIG. 1, the self-heating solder flux material 102 may be applied to one or more regions of the printed circuit board 104.

The process 700 includes performing soldering operation(s) at the region(s) of the printed circuit board, at 706. For example, referring to FIG. 1, after the self-heating solder flux material 102 has been applied to selected regions of the printed circuit board 104, soldering operation(s) may be performed on the printed circuit board 104. Examples of soldering operations include a hand soldering operation or a rework operation.

The process 700 includes exposing the printed circuit board to a stimulus, at 708. The stimulus may include a magnetic field, UV light, or a combination thereof. For example, referring to FIG. 1, after the soldering operation(s) have been performed, the printed circuit board 104 may be exposed to a magnetic field, UV light, or a combination thereof. To illustrate, when the microcapsules 106 depicted in FIG. 1 correspond to the microcapsules 206 depicted in FIG. 2, the magnetic field generating device 232 illustrated in FIG. 2 may expose the printed circuit board 104 to the magnetic field 234. When the microcapsules depicted in FIG. 1 correspond to the microcapsules 306 depicted in FIG. 3, the UV light source 332 illustrated in FIG. 3 may expose the printed circuit board 104 to the UV light 334.

At 710, FIG. 7 illustrates that exposure of the region(s) to the stimulus, at 708, resulting in the microcapsules generating heat to volatilize residual solvent. For example, when the microcapsules 106 depicted in FIG. 1 correspond to the microcapsules 206 depicted in FIG. 2, the heat 236 released by the microcapsules 206 as a result of exposure to the magnetic field 234 may be sufficient to reach a temperature that volatilizes remaining carrier solvent (e.g., IPA) that was present in the no-clean solder flux 108. As another example, when the microcapsules 106 depicted in FIG. 1 correspond to the microcapsules 306 depicted in FIG. 3, the heat 336 released by the microcapsules 306 as a result of exposure to the UV light 334 may be sufficient to reach a temperature that volatilizes remaining carrier solvent (e.g., IPA) that was present in the no-clean solder flux 108.

Thus, FIG. 7 illustrates an example of a process of utilizing the self-heating solder flux material of the present disclosure. After the self-heating solder flux material of the present disclosure has been applied to region(s) of a printed circuit board and soldering operation(s) have been performed on the printed circuit board, the printed circuit board may be exposed to a magnetic field, UV light, or a combination thereof. Exposure to the magnetic field and/or the UV light triggers the microcapsules to release heat in order to ensure that solder flux residue reaches a sufficient temperature to volatilize remaining solvent carrier, thereby reducing risk of electrochemical migration and electrical failures associated with conventional no-clean solder flux materials.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A self-heating solder flux material comprising:
a solder flux material that includes a solvent carrier;
and a multi-compartment microcapsule that includes:
a first compartment that contains a first reactant;
a second compartment that contains a second reactant; and
an isolating structure separating the first compartment from the second compartment, wherein the isolating structure is adapted to rupture in response to a stimulus, and wherein rupture of the isolating structure results in an exothermic reaction between the first reactant and the second reactant that generates heat to volatilize the solvent carrier.

2. The self-heating solder flux material of claim 1, wherein the stimulus includes a magnetic field.

3. The self-heating solder flux material of claim 1, wherein the stimulus includes ultraviolet (UV) light.

4. The self-heating solder flux material of claim 1, wherein the multi-compartment microcapsule is a shell-in-shell microcapsule comprising an inner shell contained within an outer shell, wherein the inner shell encapsulates the first compartment, wherein the outer shell encapsulates the second compartment, and wherein the inner shell defines the isolating structure.

5. The self-heating solder flux material of claim 4, wherein magnetic nanoparticles are embedded in the inner shell, and wherein the stimulus includes a magnetic field to dislodge the magnetic nanoparticles from the inner shell to rupture the inner shell.

6. The self-heating solder flux material of claim 5, wherein the magnetic nanoparticles include magnetite ($Fe_3O_4$) particles.

7. The self-heating solder flux material of claim 4, wherein:
the inner shell includes a first material that degrades when exposed to a particular wavelength of ultraviolet (UV) light; and
the outer shell includes a second material that is transparent to the particular wavelength of UV light.

8. The self-heating solder flux material of claim 7, wherein the first material includes a photodimer.

9. The self-heating solder flux material of claim 7, wherein the first material includes nitrocinnamate-based material or an azobenzene-based material.

10. The self-heating solder flux material of claim 1, wherein the first compartment contains a metal, and wherein the second compartment contains an oxidizer.

11. The self-heating solder flux material of claim 1, wherein the first compartment contains iron, and wherein the second compartment contains hydrogen peroxide.

12. The self-heating solder flux material of claim 1, wherein the first compartment contains iron and ferric nitrate, and wherein the second compartment contains hydrogen peroxide.

13. The self-heating solder flux material of claim 1, wherein the solvent carrier includes isopropyl alcohol.

14. The self-heating solder flux material of claim 1, wherein the heat generated by the exothermic reaction results in a temperature increase that is sufficient to volatilize the solvent carrier but is insufficient to reflow a solder material.

15. A self-heating solder flux material comprising:
a solder flux material that includes a solvent carrier;
and a shell-in-shell microcapsule that includes:
an inner shell contained within an outer shell, the inner shell encapsulating a first compartment that contains a first reactant;
the outer shell that encapsulates a second compartment that contains a second reactant; and
an isolating structure defined by the inner shell, the isolating structure separating the first compartment from the second compartment,
wherein the isolating structure is adapted to rupture in response to exposure to a magnetic field, ultraviolet (UV) light, or a combination thereof, and
wherein rupture of the isolating structure results in an exothermic reaction between the first reactant and the second reactant that generates heat to volatilize the solvent carrier.

16. The self-heating solder flux material of claim 15, wherein magnetic nanoparticles are embedded in the inner shell, and wherein the magnetic field dislodges the magnetic nanoparticles from the inner shell to rupture the inner shell.

17. The self-heating solder flux material of claim 15, wherein:
the inner shell includes a first material that degrades when exposed to a particular wavelength of ultraviolet (UV) light; and the outer shell includes a second material that is transparent to the particular wavelength of UV light.

18. A process of utilizing a self-heating solder flux material, the process comprising:
applying a self-heating solder flux material to a region of a printed circuit board,
wherein the self-heating solder flux material includes:
a solder flux material that includes a solvent carrier;
and a multi-compartment microcapsule that includes:
a first compartment that contains a first reactant;
a second compartment that contains a second reactant; and
an isolating structure separating the first compartment from the second compartment;
performing a soldering operation at the region of the printed circuit board; and after performing the soldering operation, exposing the printed circuit board to a stimulus, wherein the isolating structure of the multi-compartment microcapsule is adapted to rupture in response to the stimulus, and wherein rupture of the isolating structure results in an exothermic reaction between the first reactant and the second reactant that generates heat to volatilize the solvent carrier.

19. The process of claim 18, wherein the stimulus includes a magnetic field, ultraviolet (UV) light, or a combination thereof.

20. The process of claim 18, wherein the soldering operation includes a hand soldering operation or a rework operation.

* * * * *